United States Patent
Kunieda et al.

(10) Patent No.: US 8,487,192 B2
(45) Date of Patent: Jul. 16, 2013

(54) PRINTED WIRING BOARD AND METHOD FOR MANUFACTURING THE SAME

(75) Inventors: Masatoshi Kunieda, Ogaki (JP); Kazuhiro Yoshikawa, Ogaki (JP); Takeshi Furusawa, Ogaki (JP)

(73) Assignee: Ibiden Co., Ltd., Ogaka-shi (JP)

( * ) Notice: Subject to any disclaimer, the term of this patent is extended or adjusted under 35 U.S.C. 154(b) by 427 days.

(21) Appl. No.: 12/946,993

(22) Filed: Nov. 16, 2010

(65) Prior Publication Data
US 2011/0139498 A1 Jun. 16, 2011

Related U.S. Application Data

(60) Provisional application No. 61/285,362, filed on Dec. 10, 2009.

(51) Int. Cl.
*H05K 3/02* (2006.01)
*H05K 3/10* (2006.01)
*H05K 1/03* (2006.01)

(52) U.S. Cl.
USPC ............................................ 174/255; 29/846

(58) Field of Classification Search
USPC .................... 29/846–854; 174/250, 255–258
See application file for complete search history.

(56) References Cited

U.S. PATENT DOCUMENTS

| | | | |
|---|---|---|---|
| 2010/0319966 A1* | 12/2010 | Liu | 174/255 |
| 2011/0139499 A1* | 6/2011 | Park et al. | 174/258 |
| 2012/0055698 A1* | 3/2012 | Won et al. | 174/251 |

FOREIGN PATENT DOCUMENTS

| | | |
|---|---|---|
| JP | 2000-323613 | 11/2000 |
| WO | WO 2008/001915 A1 | 1/2008 |

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A printed wiring board including an insulation layer made of a resin material and having first and second surfaces, the insulation layer having an opening portion opened on the second surface, a conductive circuit having first and second surfaces, the conductive circuit being embedded in the insulation layer such that the first surface of the conductive circuit is formed flush with the first surface of the insulation layer and that the second surface of the conductive circuit is exposed through the opening portion of the insulation layer, a first surface-treatment film formed on the conductive circuit and facing the first surface of the conductive circuit, and a second surface-treatment film formed on the conductive circuit and facing the second surface of the conductive circuit and in the opening portion of the insulation layer.

18 Claims, 12 Drawing Sheets

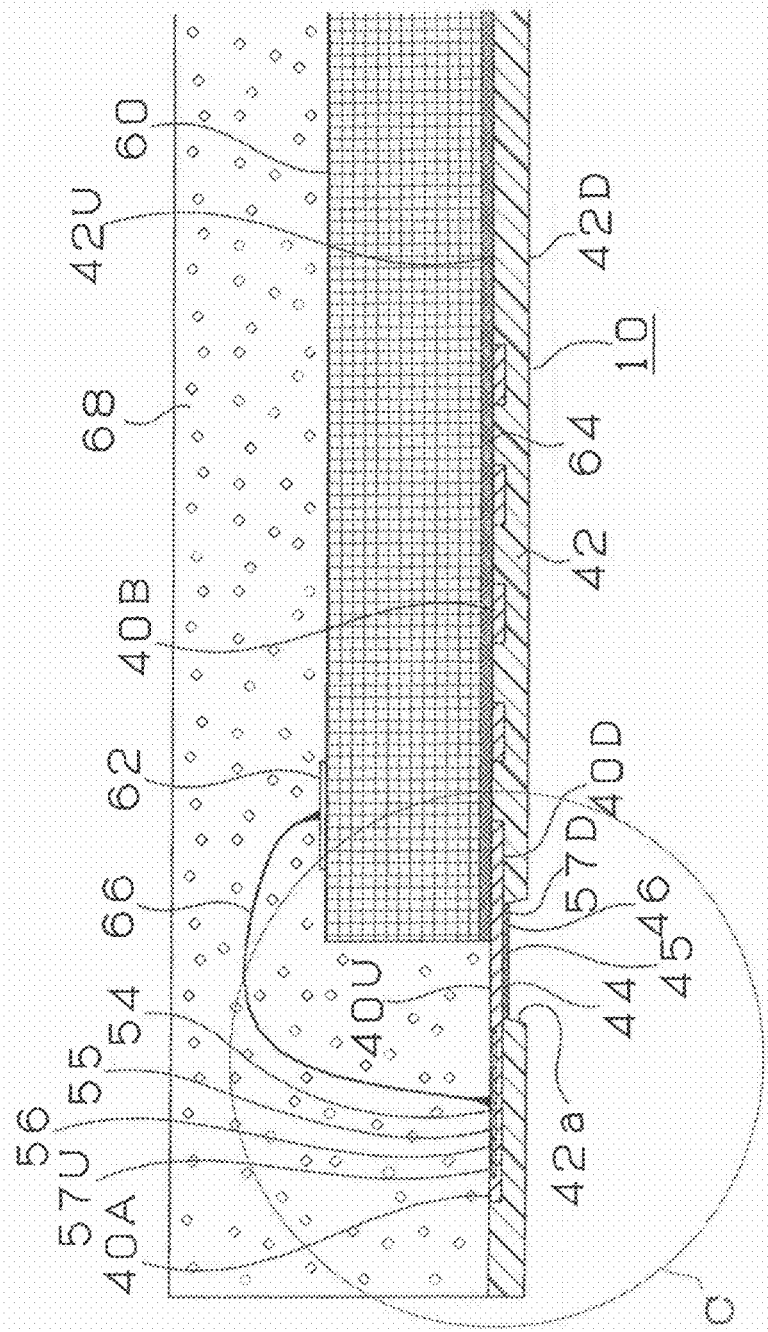

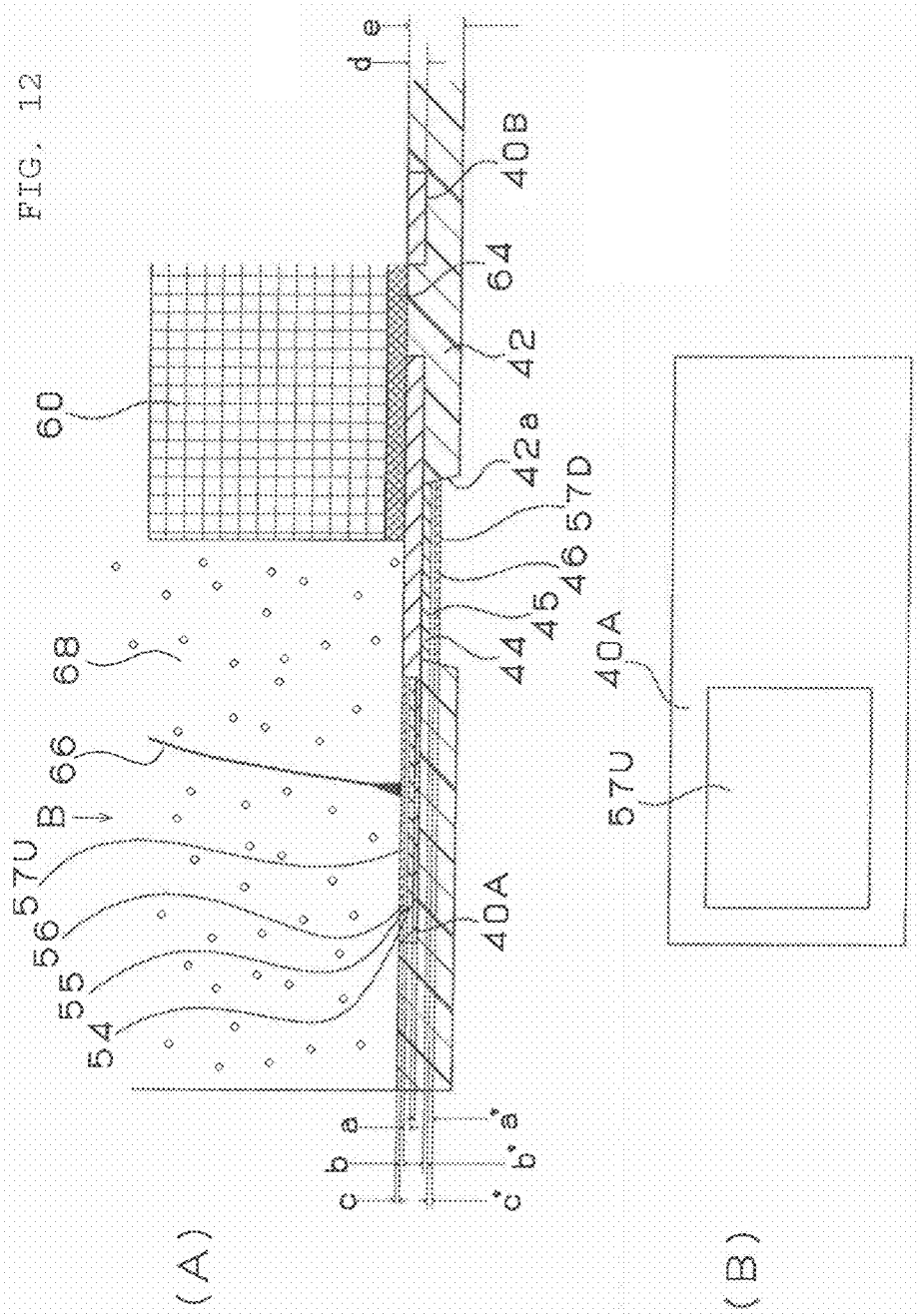

PRINTED WIRING BOARD AND METHOD FOR MANUFACTURING THE SAME

CROSS-REFERENCE TO RELATED APPLICATIONS

The present application claims the benefits of priority to U.S. Application No. 61/285,362, filed Dec. 10, 2009. The contents of that application are incorporated herein by reference in their entirety.

BACKGROUND OF THE INVENTION

1. Field of the Invention

The present invention relates to a thin-type printed wiring board with a mounted semiconductor element and to a method for manufacturing such a printed wiring board.

2. Discussion of the Background

In Japanese Laid-Open Patent Publication No. 2000-323613, a method is described for manufacturing a multilayer circuit board formed without a core substrate so that a thinner-type board is achieved. In Japanese Laid-Open Patent Publication No. 2000-323613, a thick metal board is etched. The contents of this publication are incorporated herein by reference in their entirety.

SUMMARY OF THE INVENTION

According to one embodiment of the present invention, a printed wiring board has an insulation layer including a resin material and having a first surface and a second surface on the opposite side of the first surface, the insulation layer having an opening portion opened on the second surface, a conductive circuit having a first surface and a second surface on the opposite side of the first surface of the conductive surface, the conductive circuit being embedded in the insulation layer such that the first surface of the conductive circuit is formed flush with the first surface of the insulation layer and that the second surface of the conductive circuit is exposed through the opening portion of the insulation layer, a first surface-treatment film formed on the conductive circuit and facing the first surface of the conductive circuit, and a second surface-treatment film formed on the conductive circuit and facing the second surface of the conductive circuit and in the opening portion of the insulation layer.

According to another embodiment of the present invention, a method for manufacturing a printed wiring board includes forming a conductive circuit on a first support body, forming an insulation layer including a resin material on the first support body such that the conductive circuit is covered with the resin material of the insulation layer, forming an opening portion in the insulation layer such that a portion of the conductive circuit is exposed through the opening portion of the insulation layer, forming a first surface-treatment film on the conductive circuit in the opening portion of the insulation layer, laminating a second support body on the insulation layer, removing the first support body from the conductive circuit and the insulation layer, forming a second surface-treatment film on the conductive circuit after the removing of the first support body, and removing the second support body from the insulation layer.

According to yet another embodiment of the present invention, a method for manufacturing a printed wiring board includes forming a first surface-treatment film on a first support body, forming a conductive circuit on the first support body such that the first surface-treatment film is covered with the conductive circuit, forming an insulation layer including a resin material on the first support body such that the conductive circuit is covered with the resin material of the insulation layer, forming an opening portion in the insulation layer such that a portion of the conductive circuit is exposed through the opening portion of the insulation layer, forming a second surface-treatment film on the conductive circuit in the opening portion of the insulation layer, laminating a second support body on the insulation layer, and removing the first support body from the insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11 is a cross-sectional view of a printed wiring board in the second embodiment;

FIG. 12(A) shows a further magnified view of the portion surrounded by circle "C" in FIG. 11; and FIG. 12(B) shows a view of a conductive circuit in FIG. 12(A) taken from arrow "B".

DETAILED DESCRIPTION OF THE EMBODIMENTS

Figure 1:
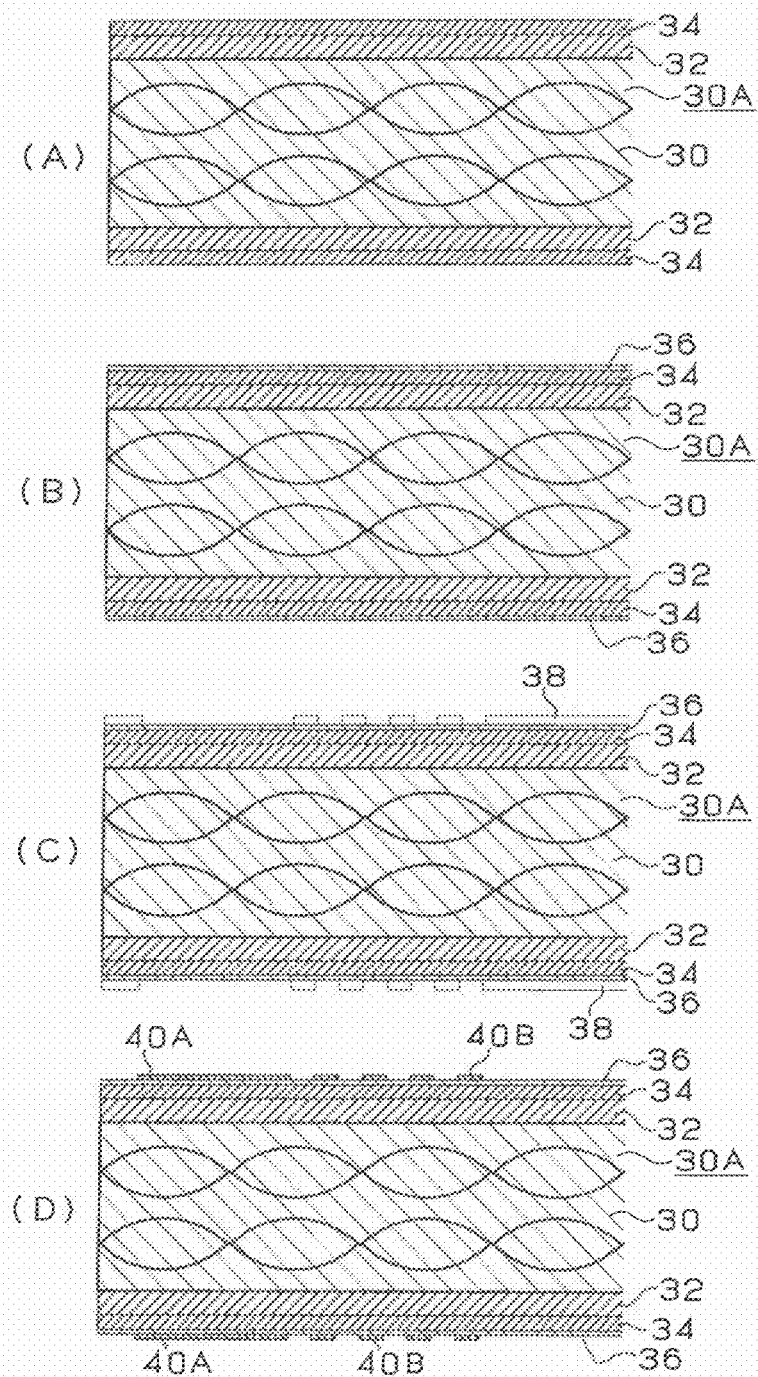
FIG. 1 are views showing steps for manufacturing a printed wiring board relating to the first embodiment of the present invention.
Figure 2:
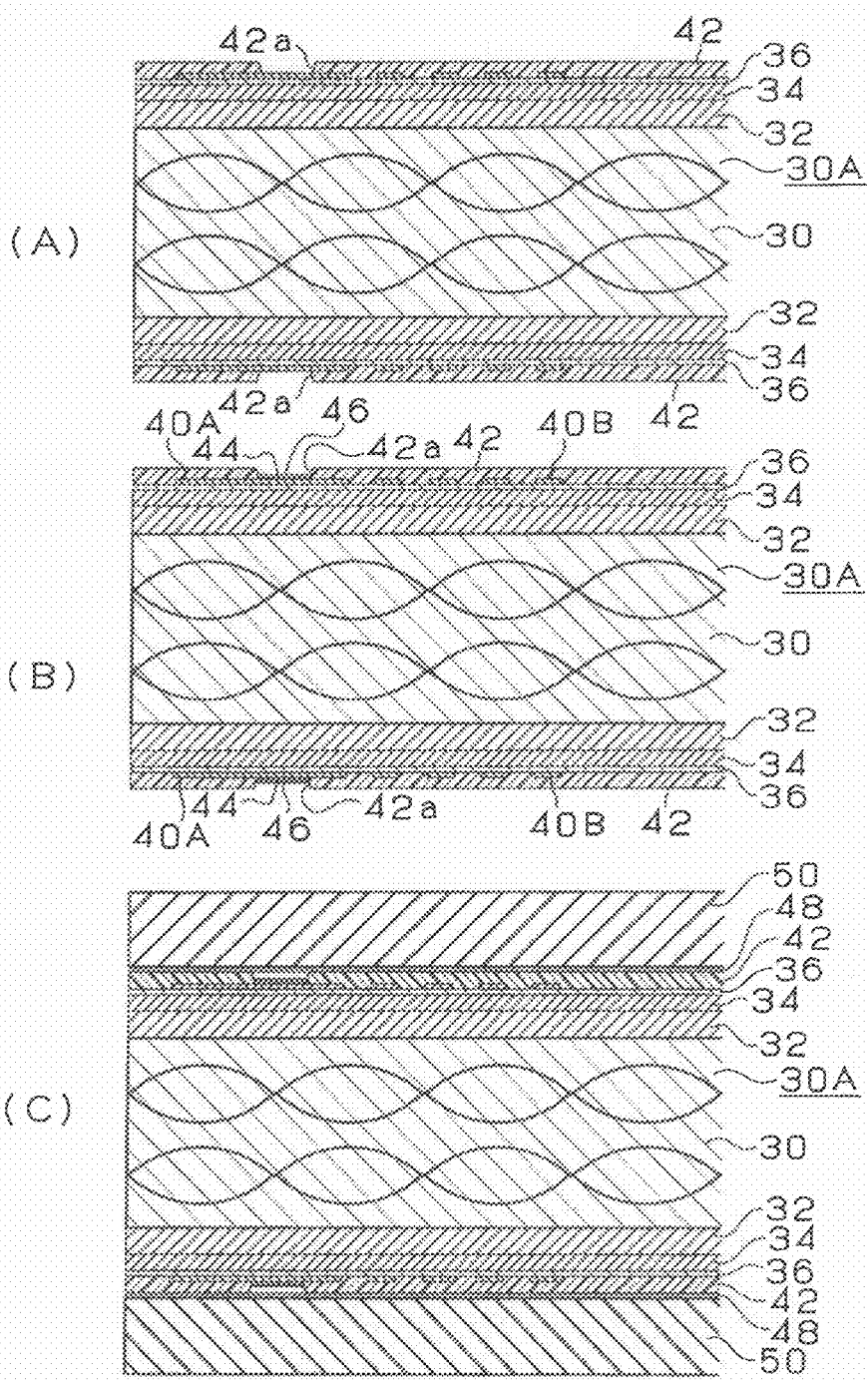
FIG. 2 are views showing steps for manufacturing a printed wiring board of the first embodiment.
Figure 3:
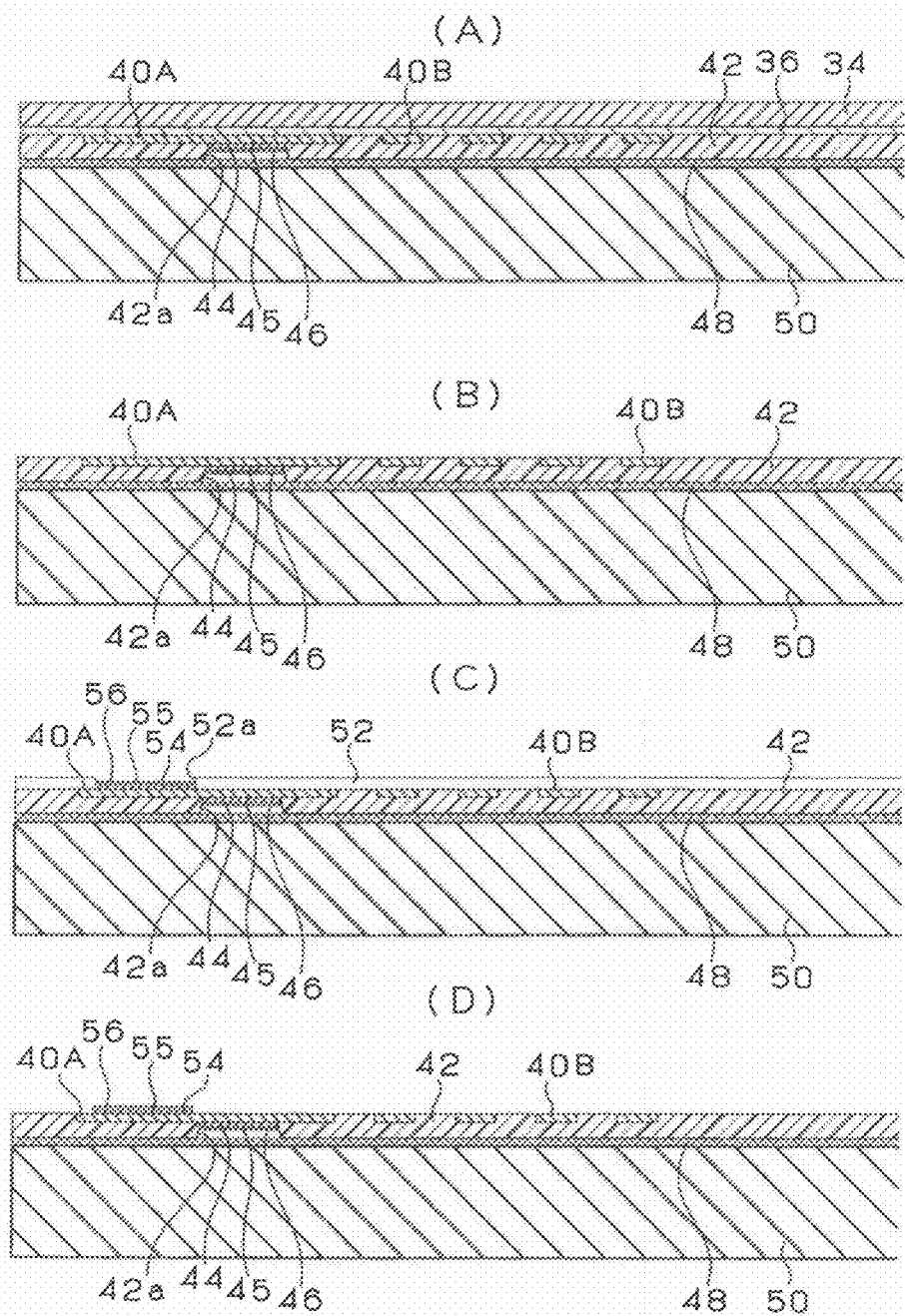
FIG. 3 are views showing steps for manufacturing a printed wiring board of the first embodiment.
Figure 4:
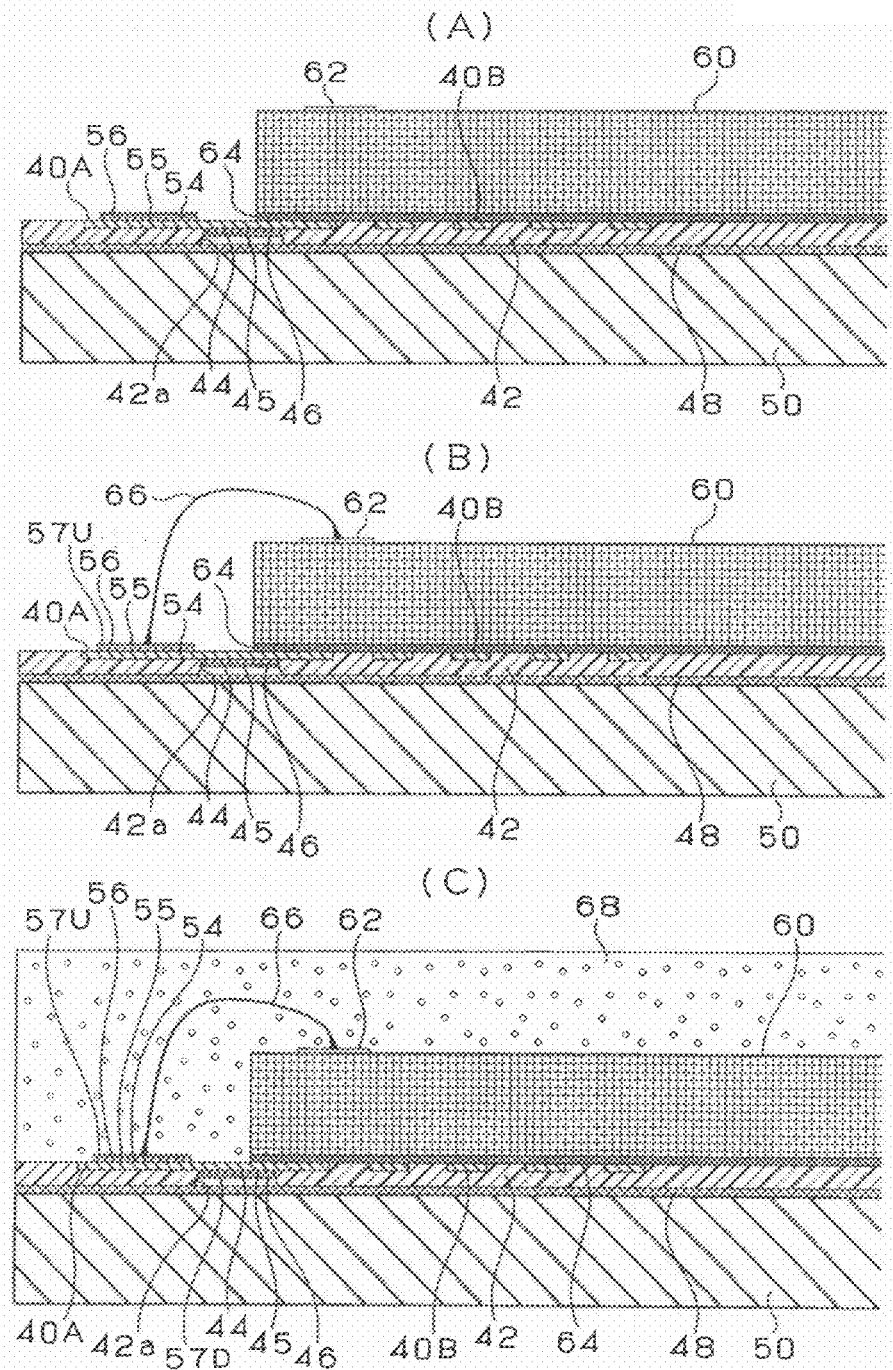
FIG. 4 are views showing steps for manufacturing a printed wiring board of the first embodiment.

The embodiments will now be described with reference to the accompanying drawings, wherein like reference numerals designate corresponding or identical elements throughout the various drawings.

First Embodiment

Figure 5:
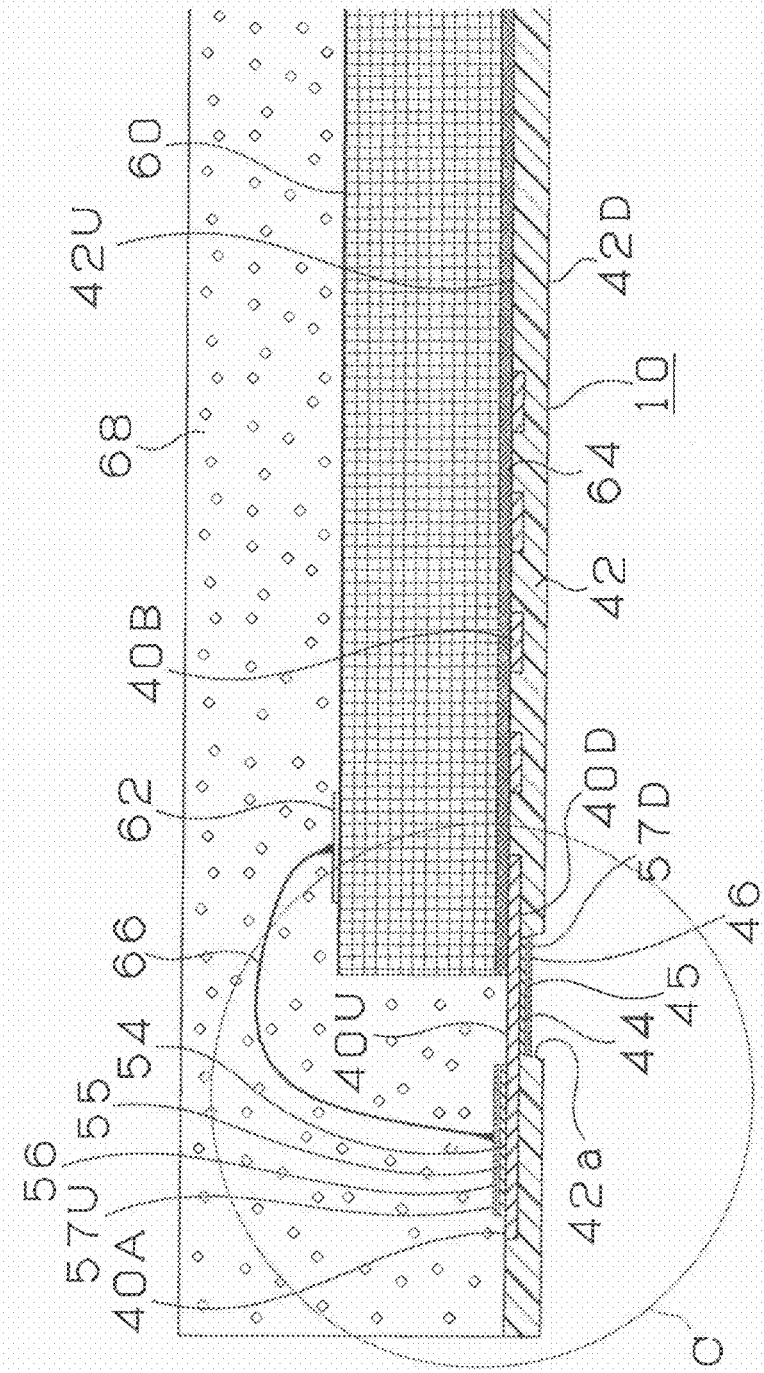
FIG. 5 is a cross-sectional view of a printed wiring board in the first embodiment.
Figure 6:
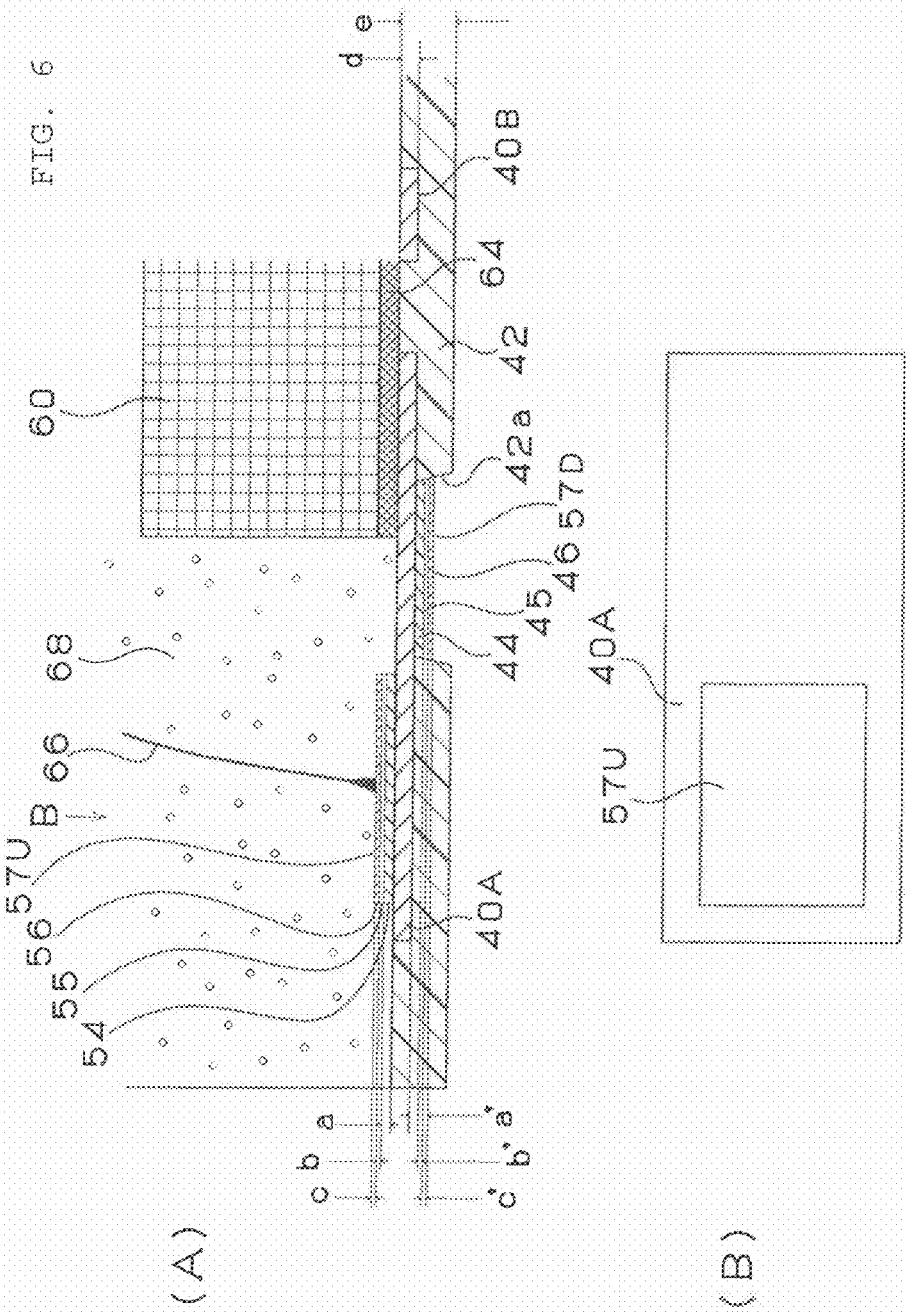
FIG. 6(A) shows a further magnified view of the portion surrounded by circle "C" in FIG. 5.
FIG. 6(B) shows a view of a conductive circuit in FIG. 6(A) taken from arrow
Figure 7:
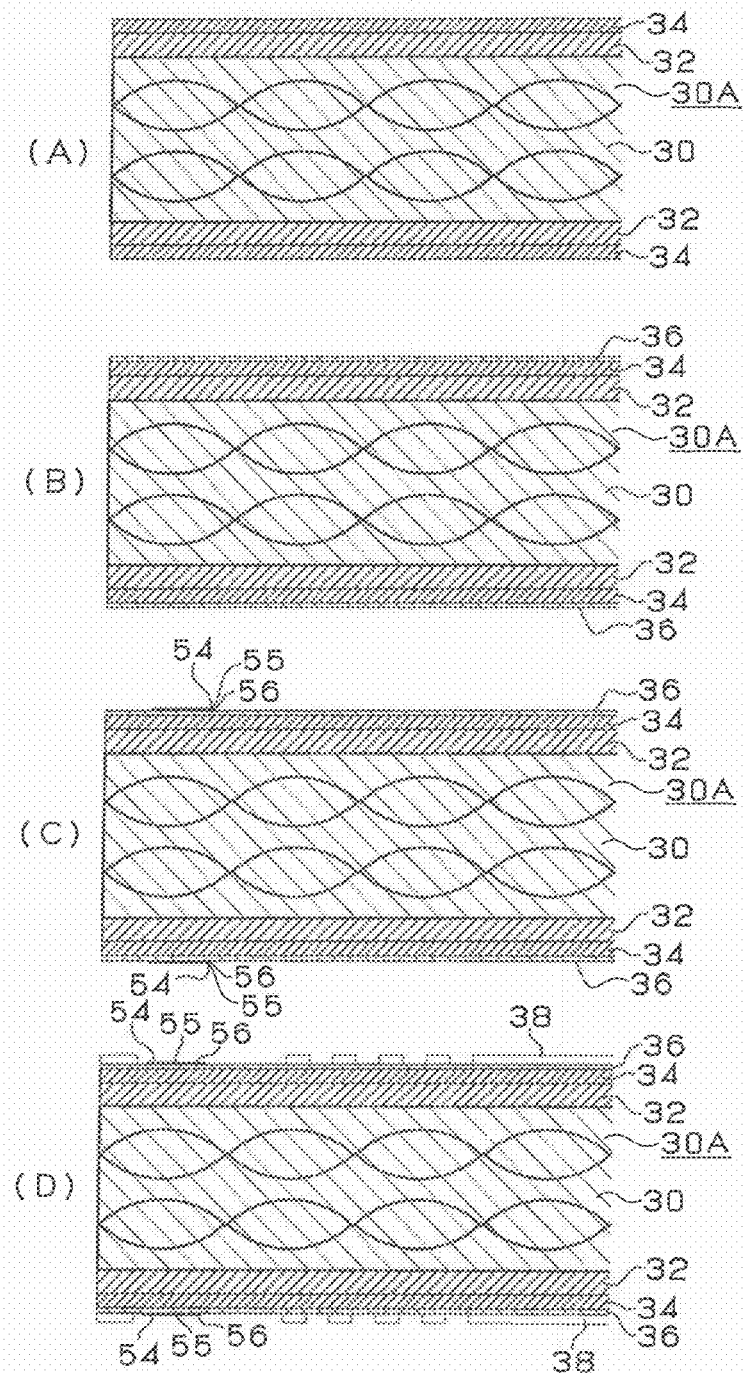
FIG. 7 are views showing steps for manufacturing a printed wiring board relating to the second embodiment of the present invention.
Figure 8:
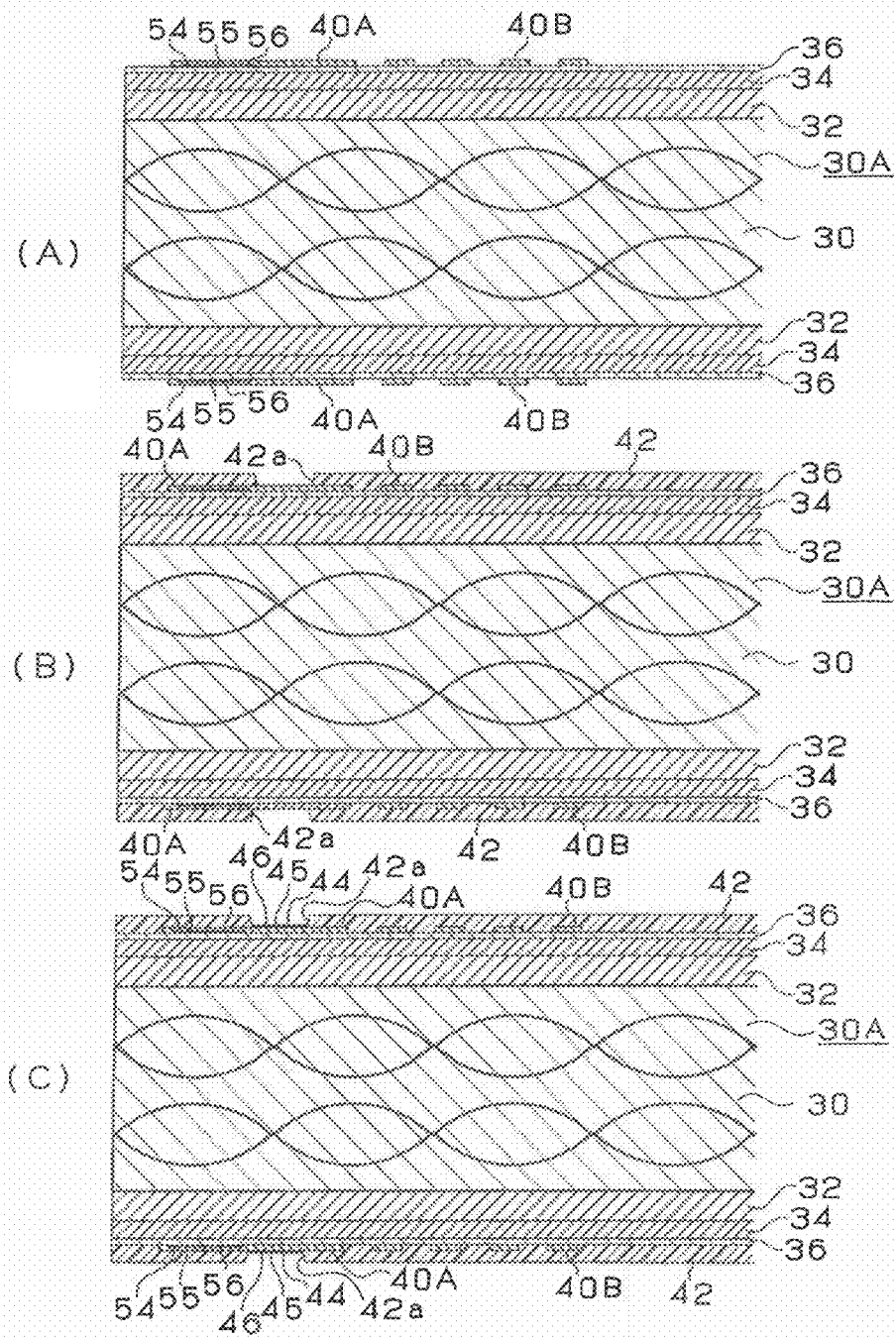
FIG. 8 are views showing steps for manufacturing a printed wiring board of the second embodiment.
Figure 9:
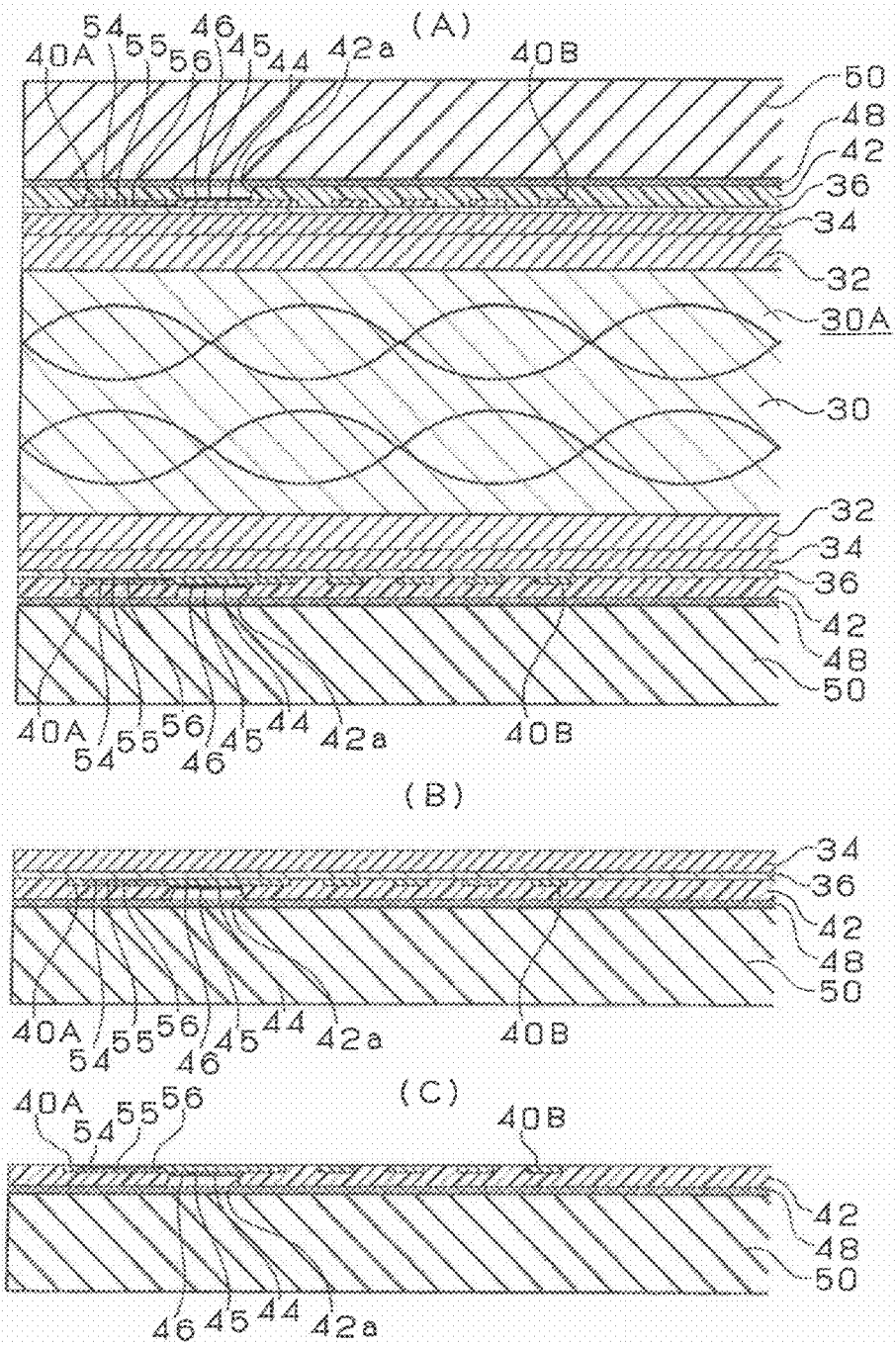
FIG. 9 are views showing steps for manufacturing a printed wiring board of the second embodiment.
Figure 10:
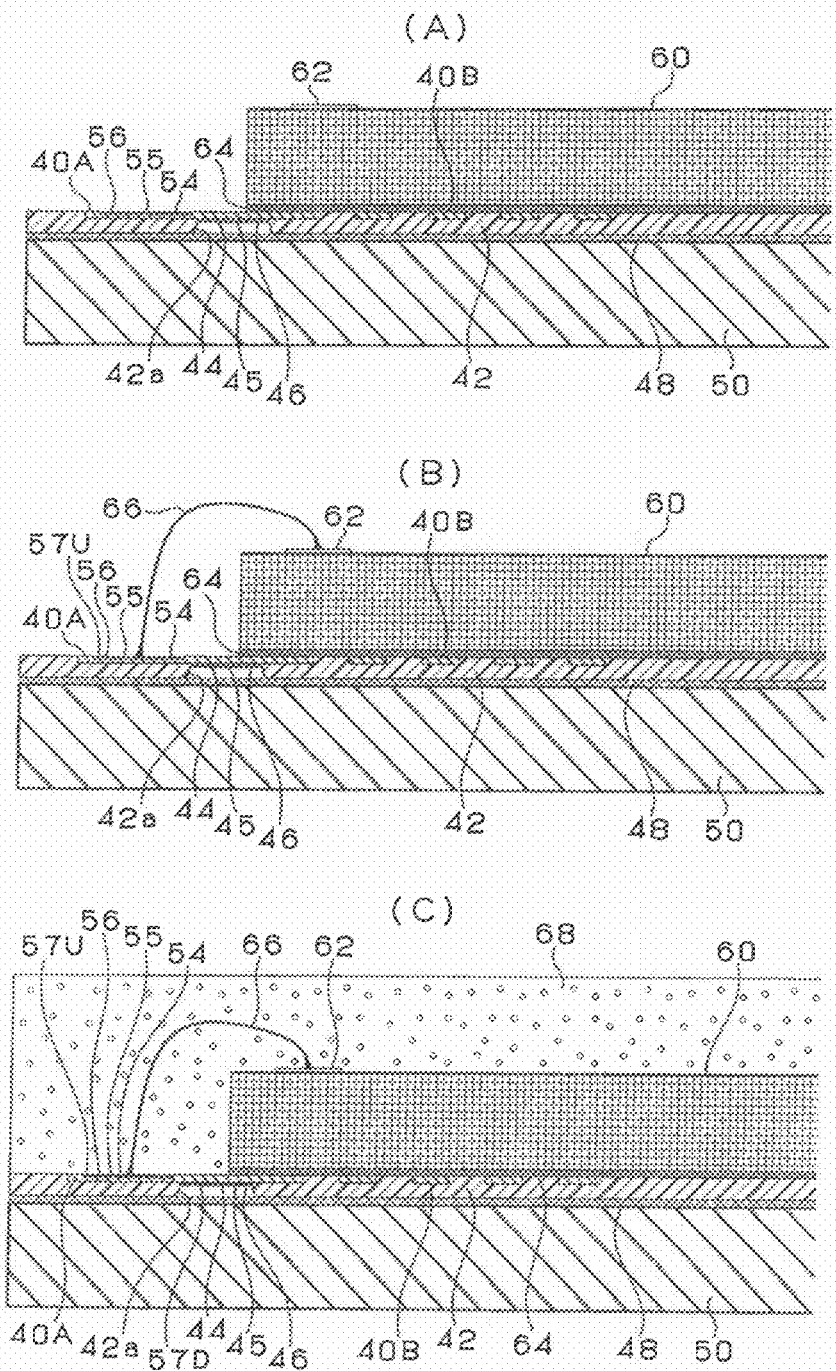
FIG. 10 are views showing steps for manufacturing a printed wiring board of the second embodiment.

A printed wiring board relating to the first embodiment is described with reference to FIGS. 5 and 6. FIG. 5 is a cross-sectional view partially showing a printed wiring board, FIG. 6(A) shows a further magnified view of the portion surrounded by circle "C" in FIG. 5, and FIG. 6(B) shows a view of a conductive circuit in FIG. 6(A) taken from arrow "B". Printed wiring board 10 is formed with single-layer resin insulation layer 42, and conductive circuits (40A) for pads and conductive circuits (40B) for wiring are formed on the upper-surface (first surface (42U)) side. The upper surfaces (first surfaces (40U)) of conductive circuits (40A) for pads and conductive circuits (40B) for wiring are formed so as to be positioned flush with the upper surface of insulation layer 42. On the upper surfaces of conductive circuits (40A) for pads, bonding pads (57U) are formed, having surface-treatment film made of nickel film 54, palladium film 55 and gold film 56, as shown in FIG. 6(A). As shown in FIG. 6(B), bonding pads (57U) are formed to be rectangular.

On the other hand, openings (42a) are formed to expose the lower-surface (second surface (40D)) side of conductive circuits (40A) for pads positioned on the lower-surface (second surface (42D)) side of insulation layer 42. On the lower surfaces of conductive circuits (40A) for pads in openings (42a), nickel film 44, palladium film 45 and gold film 56 are formed in that order. Wire bonding may be arranged on pads (57D), but solder bumps may also be formed.

As shown in FIG. 5, memory IC chip 60 is mounted by means of DAF (Die Attach Film) 64 on an area of first surface (42U) of insulation layer 42 which includes part of conductive circuits (40A) for pads and the first surfaces of conductive circuits (40B) for wiring. Bonding pads (57U) and terminals 62 of IC chip 60 are connected by bonding wire 66 made of gold wire. On first surface (42U) of insulation layer 42, mold resin 68 is arranged to cover IC chip 60.

As shown in FIG. 6(A), insulation layer 42 is formed to have thickness (e) (30 μm). Conductive circuits (40A, 40B) are formed to have thickness (d) (10 μm). Regarding bonding pads (57U), nickel film 54 is formed to have thickness (a) (3 μm), palladium film 55 to have thickness (b) (0.3 μm) and gold film 56 to have thickness (c) (0.4 μm). Regarding pads (57D), nickel film 44 is formed to have thickness (a') (3 μm), palladium film 45 to have thickness (b') (0.3 μm) and gold film 46 to have thickness (c') (0.4 μm).

In a printed wiring board of the first embodiment, since bonding pads (57U) and pads (57D) (surface-treatment films) which construct terminals are made of electroless nickel/palladium/gold film, connection reliability is high when gold wire is used for wire bonding.

Next, a method for manufacturing a printed wiring board of the first embodiment is described with reference to views of manufacturing steps in FIGS. 1-4. Prepared as a starting material is double-sided copper-clad laminate (30A), which is made by laminating 5-250 μm-thick copper foil 32 on both surfaces of insulative substrate 30 made of 0.2-0.8 mm-thick glass epoxy resin or BT (bismaleimide triazine) resin. Then, 100 μm-thick carrier copper foil 34 is welded onto copper foils 32 using ultrasonic waves (FIG. 1(A)). Ni film 36 is formed on carrier copper foils 34 by sputtering (FIG. 1(B)). Then, a plating resist composition is coated and patterned through exposure and development to form plating resists 38 (FIG. 1(C)). Conductive circuits (40A, 40B) are formed by electrolytic copper plating on areas where plating resists are not formed, and the plating resists are removed (FIG. 1(D)).

Resin film for interlayer resin insulation layers (brand name; ABF-45SH: made by Ajinomoto) to form interlayer resin insulation layers in a built-up multilayer wiring board is placed on Ni films 36 so that conductive circuits (40A, 40B) will be embedded. After being preliminarily pressed and cut to size, the films are laminated by using vacuum laminator equipment and 30 μm-thick insulation layers 42 are formed. Then, openings (42a) are formed by laser to expose conductive circuits (40A) (FIG. 2(A)). Here, the openings are formed by laser, but such openings may also be formed by exposure and development.

After smears in the openings are removed by O2 plasma, nickel film 54, palladium film 55 and gold film 56 are formed by performing electroless nickel plating, electroless palladium plating and electroless gold plating on conductive circuits (40A) exposed through openings (42a) (FIG. 2(B)).

Support body 50 made of either resin, metal or ceramic is laminated on insulation layers 42 with removable layer 48 therebetween (FIG. 2(C)). Carrier copper foils 34 are removed (FIG. 3(A)). In the present embodiment, since insulation layers 42 are formed on both surfaces by using double-sided copper-clad laminate (30A), forces will be exerted uniformly on the upper and lower surfaces. Thus, flat insulation layers 42 may be formed.

After carrier copper foil 34 is removed by copper etching, Ni-sputtered film 36 is further removed by nickel etching to expose insulation layer 42 (FIG. 3(B)).

After plating resist film 52 is formed on insulation layer 42 by electroless nickel plating, electroless palladium plating and electroless gold plating, nickel film 54, palladium film 55 and gold film 56 are formed on conductive circuits 40 exposed through openings (52a) in plating resist film 52 (FIG. 3(C)). Then, plating resist film 52 is removed (FIG. 3(D)). Gold film 56 is preferred to be formed by displacement plating and reduction plating. By doing so, gold film may be thickened while nickel film 54 is suppressed from being corroded.

Memory IC chip 60 is mounted by means of DAF (Die Attach Film) 64 on an area of the first surface of insulation layer 42 which includes part of conductive circuits (40A) for pads and the first surfaces of conductive circuits (40B) for wiring (FIG. 4(A)). Bonding pads (57U), positioned on conductive circuits (40A) and made of nickel film 54, palladium film 55 and gold film 56, and terminals 62 of the IC chip are connected by bonding wires 66. Mold resin 68 is arranged on first surface (42U) of insulation layer 42 to cover IC chip 60 (FIG. 4(C)). Then, support body 50 is detached by using removable layer 48. A printed wiring board is completed (FIG. 5).

In a method for manufacturing a printed wiring board according to the first embodiment, conductive circuits (40A, 40B) are formed on Ni-sputtered films 36 on double-sided copper-clad laminate (30A), insulation layers 42 are formed on Ni-sputtered films 36 by using interlayer resin insulation material, and then support bodies 50 are laminated. Since insulation layers are cured while being sandwiched by double-sided copper-clad laminate (30A) and support bodies 50, flat insulation layers 42 may be formed from thin interlayer resin insulation material. Then, double-sided copper-clad laminate (30A) is removed, and IC chip 60 is mounted on insulation layer 42 while being supported by support body 50. After mold resin 68 is arranged on insulation layer 42 to cover IC chip 60, and strength is provided by mold resin 68 and IC chip 60, support body 50 is removed. Accordingly, thin insulation layer 42 which does not have mechanical strength may be formed, and solder-resist layers to maintain surface strength are not required. By reducing the thickness of a printed wiring board, heat from IC chip 60 may be effectively dissipated. Since conductive circuits (40A, 40B) are embedded in the first-surface side of insulation layer 42 and are positioned flush with the first surface of insulation layer 42, insulation layer 42 is made flat without having uneven portions. Thus, IC chip 60 may be mounted with high reliability.

Second Embodiment

A printed wiring board relating to the second embodiment is described with reference to FIGS. 11 and 12. FIG. 11 is a cross-sectional view partially showing a printed wiring board, FIG. 12(A) shows a further magnified view of the portion surrounded by circle "C" in FIG. 11, and FIG. 12(B)

shows a view of a conductive circuit in FIG. 12(A) taken from arrow "B". Printed wiring board 10 is formed with single-layer resin insulation layer 42, and conductive circuits (40A) for pads and conductive circuits (40B) for wiring are formed on the upper-surface (first surface (42U)) side. The upper surfaces (first surfaces (40U)) of conductive circuits (40A) for pads and conductive circuits (40B) for wiring are formed so as to be positioned flush with the upper surface of insulation layer 42. On the upper surfaces of conductive circuits (40A) for pads, surface-treatment film made of nickel film 54, palladium film 55 and gold film 56 is formed as shown in FIG. 12(A). The upper surfaces of bonding pads (57U) are formed so as to be positioned flush with the upper surfaces of conductive circuits (40A) for pads (first surfaces (40U)) and the upper surface of insulation layer 42. As shown in FIG. 12(B), bonding pads (57U) are formed to be rectangular.

On the other hand, on the lower-surface (second surface (42D)) side of insulation layer 42, openings (42a) are formed to expose the lower-surface (second surface (40D)) side of conductive circuits (40A) for pads. Formed on the lower surfaces of conductive circuits (40A) for pads in openings (42a) are pads (57D) having surface-treatment film made of nickel film 44, palladium film 45 and gold film 46. Wire bonding may be arranged on pads (57D), but solder bumps may also be formed.

As shown in FIG. 11, memory IC chip 60 is mounted by means of DAF (Die Attach Film) 64 on an area of the first surface of insulation layer 42 which includes part of conductive circuits (40A) for pads and the first surfaces of conductive circuits (40B) for wiring. Bonding pads (57U) and terminals 62 of IC chip 60 are connected by bonding wire 66 made of gold wire. On first surface (42U) of insulation layer 42, mold resin 68 is arranged to cover IC chip 60.

As shown in FIG. 12(A), insulation layer 42 is formed to have thickness (e) (30 μm). Conductive circuits (40A, 40B) are formed to have thickness (d) (10 μm). Regarding bonding pads (57U), nickel film 54 is formed to have thickness (a) (3 μm), palladium film 55 to have thickness (b) (0.3 μm) and gold film 56 to have thickness (c) (0.4 μm). Regarding pads (57D), nickel film 44 is formed to have thickness (a') (3 μm), palladium film 45 to have thickness (b') (0.3 μm) and gold film 46 to have thickness (c') (0.4 μm).

In a printed wiring board of the second embodiment, insulation layers 42 are thin, since they are made of interlayer resin insulation material. Thus, heat from mounted IC chip 60 may be effectively dissipated. Since conductive circuits (40A, 40B) are embedded in the first-surface (42U) side of insulation layer 42 and are positioned flush with the first surface of insulation layer 42, the insulation layer is made flat without having uneven portions. Thus, an IC chip may be mounted with high reliability.

In a printed wiring board of the second embodiment, since bonding pads (57U) made of nickel film 54, palladium film 55 and gold film 56 are positioned to be flush with the first surfaces of conductive circuits (40A) and insulation layer 42 is flat without having uneven portions, semiconductor elements such as an IC chip or the like may be mounted with high reliability.

Next, a method for manufacturing a printed wiring board of the second embodiment is described with reference to views of manufacturing steps in FIGS. 7-10. Prepared as a starting material is double-sided copper-clad laminate (30A), which is made by laminating 5-250 μm-thick copper foil 32 on both surfaces of insulative substrate 30 made of 0.2-0.8 mm-thick glass epoxy resin or BT (bismaleimide triazine) resin. Then, 100 μm-thick carrier copper foil 34 is welded on copper foils 32 using ultrasonic waves (FIG. 7(A)). Ni film 36 is formed on carrier copper foils 34 by sputtering (FIG. 7(B)).

After plating resist film having openings is formed on Ni films 36, by performing electroless nickel plating, electroless palladium plating and electroless gold plating, nickel film 54, palladium film 55 and gold film 56 are formed on Ni films 36 exposed through the openings in plating resist films. Then, plating resist films 52 are removed (FIG. 7(C)).

Next, a plating resist composition is coated and patterned through exposure to light and development, and plating resists 38 are formed (FIG. 7(D)). Conductive circuits (40A, 40B) are formed by electrolytic copper plating in areas where plating resists are not formed, and plating resists are removed (FIG. 8(A)).

Resin film for interlayer resin insulation layers (brand name; ABF-45SH: made by Ajinomoto) is placed on Ni films 36 so that conductive circuits (40A, 40B) will be embedded. After being preliminarily pressed and cut to size, the films are laminated by using vacuum laminator equipment and 30 μm-thick insulation layers 42 are formed. Then, openings (42a) are formed by laser to expose conductive circuits (40A) (FIG. 8(B)). Here, the openings are formed by laser, but such openings may also be formed by exposure and development.

After smears in the openings are removed by O2 plasma, nickel film 54, palladium film 55 and gold film 56 are formed by performing electroless nickel plating, electroless palladium plating and electroless gold plating on conductive circuits (40a) exposed through openings (42a) (FIG. 8(C)).

Support body 50 made of either resin, metal or ceramic is laminated on insulation layers 42 with removable layer 48 therebetween (FIG. 9(A). Carrier copper foils 34 are removed (FIG. 9(B)). In the second embodiment, since insulation layers 42 are formed on both surfaces by using double-sided copper-clad laminate (30A), forces will be exerted uniformly on the upper and lower surfaces. Thus, flat insulation layers 42 may be formed.

After carrier copper foil 34 is removed by copper etching, Ni-sputtered film 36 is further removed by nickel etching to expose insulation layer 42 (FIG. 9(C)).

Memory IC chip 60 is mounted by means of DAF (Die Attach Film) 64 on an area of the first surface of insulation layer 42 which includes part of conductive circuits (40A) for pads and the first surfaces of conductive circuits (40B) for wiring (FIG. 10(A)). Bonding pads (57U), positioned on conductive circuits (40A) and made of nickel film 54, palladium film 55 and gold film 56, and terminals 62 of the IC chip are connected by bonding wires 66. Mold resin 68 is arranged on first surface (42U) of insulation layer 42 to cover IC chip 60 (FIG. 10(C)). Then, support body 50 is detached by using removable layer 48. A printed wiring board is completed (FIG. 11).

In a method for manufacturing a printed wiring board according to the second embodiment, after the first surface-treatment film (nickel film 54, palladium film 55 and gold film 56) is formed, conductive circuits 40 are formed to cover the first-surface side of the surface-treatment film. Thus, the first surface-treatment film (nickel film 54, palladium film 55 and gold film 56) is positioned flush with the first surfaces of conductive circuits. Accordingly, the insulation layer is made flat without having uneven portions, allowing a semiconductor element to be mounted with high reliability.

A printed wiring board described in one embodiment has the following: an insulation layer with a first surface and a second surface opposite the first surface, and having an opening portion opened on the second surface; a conductive circuit embedded in the first-surface side of the insulation layer, and having a first surface positioned flush with the first surface of the insulation layer and a second surface opposite the first surface and exposed through the opening portion; a first surface-treatment film formed on the first-surface side of the conductive circuit; and a second surface-treatment film formed on the second surface of the conductive circuit exposed through the opening portion.

In the printed wiring board according to such an embodiment, the insulation layer can be formed thin since it is made of interlayer resin insulation material. Thus, heat from the mounted semiconductor element may be dissipated effectively. Since conductive circuits are embedded in the first-surface side of an insulation layer and positioned flush with the first surface of the insulation layer, the insulation layer is flat without uneven portions. Thus, a semiconductor element may be mounted with high reliability.

In the above embodiments, an example is described to show a printed wiring board on which an IC chip is mounted. However, the structure of the present invention may also be suitably applied to situations in which multiple IC chips are mounted.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
an insulation layer comprising a resin material and having a first surface and a second surface on an opposite side of the first surface, the insulation layer having an opening portion opened on the second surface;
a conductive circuit having a first surface and a second surface on an opposite side of the first surface of the conductive surface, the conductive circuit being embedded in the insulation layer such that the first surface of the conductive circuit is formed flush with the first surface of the insulation layer and that the second surface of the conductive circuit is exposed through the opening portion of the insulation layer;
a first surface-treatment film formed on the conductive circuit and facing the first surface of the conductive circuit; and
a second surface-treatment film formed on the conductive circuit and facing the second surface of the conductive circuit and in the opening portion of the insulation layer.

2. The printed wiring board according to claim 1, wherein the first surface-treatment film is formed on the first surface of the conductive circuit.

3. The printed wiring board according to claim 1, wherein the first surface-treatment film is formed flush with the first surface of the conductive circuit.

4. The printed wiring board according to claim 1, wherein each of the first surface-treatment film and the second surface-treatment film comprises an electroless plated film.

5. The printed wiring board according to claim 1, wherein at least one of the first surface-treatment film and the second surface-treatment film comprises nickel, palladium and gold.

6. The printed wiring board according to claim 1, wherein each of the first surface-treatment film and the second surface-treatment film comprises nickel, palladium and gold.

7. The printed wiring board according to claim 1, wherein at least one of the first surface-treatment film and the second surface-treatment film comprises a layer comprising nickel, a layer comprising palladium layer and a layer comprising gold.

8. The printed wiring board according to claim 1, wherein each of the first surface-treatment film and the second surface-treatment film comprises a layer comprising nickel, a layer comprising palladium layer and a layer comprising gold.

9. The printed wiring board according to claim 1, wherein the conductive circuit is formed in a single layer comprising a metal.

10. The printed wiring board according to claim 1, wherein the conductive circuit is formed in a single layer formed by electrolytic copper plating.

11. The printed wiring board according to claim 1, wherein the conductive circuit and the insulation layer satisfy $0.2<a/b<0.8$ where a is a thickness of the conductive circuit and b is a thickness of the insulation layer.

12. A method for manufacturing a printed wiring board, comprising:
forming a conductive circuit on a first support body;
forming an insulation layer comprising a resin material on the first support body such that the conductive circuit is covered with the resin material of the insulation layer;
forming an opening portion in the insulation layer such that a portion of the conductive circuit is exposed through the opening portion of the insulation layer;
forming a first surface-treatment film on the conductive circuit in the opening portion of the insulation layer;
laminating a second support body on the insulation layer;
removing the first support body from the conductive circuit and the insulation layer;
forming a second surface-treatment film on the conductive circuit after the removing of the first support body; and
removing the second support body from the insulation layer.

13. The method for manufacturing a printed wiring board according to claim 12, wherein at least one of the first surface-treatment film and the second surface-treatment film is formed by electroless plating.

14. The method for manufacturing a printed wiring board according to claim 12, wherein each of the first surface-treatment film and the second surface-treatment film is formed by electroless plating.

15. The method for manufacturing a printed wiring board according to claim 12, wherein the conductive circuit is formed in a single layer comprising a metal.

16. The method for manufacturing a printed wiring board according to claim 12, wherein the conductive circuit is formed in a single layer formed by electrolytic copper plating.

17. The method for manufacturing a printed wiring board according to claim 1, wherein the conductive circuit and the insulation layer satisfy $0.2<a/b<0.8$ where a is a thickness of the conductive circuit and b is a thickness of the insulation layer.

18. A method for manufacturing a printed wiring board, comprising:
forming a first surface-treatment film on a first support body;
forming a conductive circuit on the first support body such that the first surface-treatment film is covered with the conductive circuit;
forming an insulation layer comprising a resin material on the first support body such that the conductive circuit is covered with the resin material of the insulation layer;
forming an opening portion in the insulation layer such that a portion of the conductive circuit is exposed through the opening portion of the insulation layer;
forming a second surface-treatment film on the conductive circuit in the opening portion of the insulation layer;
laminating a second support body on the insulation layer; and
removing the first support body from the insulation layer.

* * * * *